April 26, 1966 R. B. IMMEL 3,248,687

UNIVERSAL TERMINAL AND COMPONENT MOUNTING DEVICE

Filed Sept. 27, 1963

WITNESSES

Theodore F. Wrobel

James F. Young

INVENTOR

Ralph B. Immel

BY

Clement J. Paznokas

ATTORNEY

United States Patent Office 3,248,687
Patented Apr. 26, 1966

3,248,687

UNIVERSAL TERMINAL AND COMPONENT MOUNTING DEVICE

Ralph B. Immel, Williamsville, N.Y., assignor to Westinghouse Electric Corporation, East Pittsburgh, Pa., a corporation of Pennsylvania Filed Sept. 27, 1963, Ser. No. 312,179
12 Claims. (Cl. 339—221)

This invention relates to electrical terminals and more particularly to a post-type terminal to which leads of a plurality of electrical circuit components such as resistors, semiconductor devices, capacitors, etc., are soldered.

In the manufacture of electrical apparatus, such as amplifiers, radios, power packs, control apparatus, etc., it is a known practice to solder or otherwise connect leads of several electrical components to a common lead-through terminal and to mount a number of such terminals in apertures of a common circuit board. Often some components are mounted on the upper side of the board and others are mounted beneath the board. Leads from components on the upper side are soldered to the heads of the terminals while leads from the lower units may be soldered to legs of the terminals extending below the under side of the board or they may be passed through hollow legs of the terminals to the upper side thereof where they are soldered.

Various types of such terminals have been proposed in the past, some having common disadvantages, others having disadvantages peculiarly their own. A common disadvantage in heretofore proposed "hollow leg" or "lead through" type of connectors is difficulty in soldering. When soldering from the top, the solder undesirably slips through or is "sucked" through the hollow leg, resulting in the use of excessive amounts of solder and assembly time, and often resulting in poor electrical connections.

Some prior art terminals are machined from relatively heavy stock. Because of their relatively large mass, such terminals have a high thermal capacity, requiring the use of considerable heat and time to bring the joint to soldering temperature, thus increasing manufacturing costs. Additionally, parts may be damaged by the excessive heat and time required. To offset this, longer leads than otherwise necessary are often employed, resulting in increased space requirements. Machined terminals are also expensive to produce.

Many punched out sheet metal terminals are provided with flat vertical heads with open end slots for the reception of leads to be soldered, the slots having thin edges (thickness of the sheet metal). This type of terminal is subject to a number of soldering problems. The major problem is retention of hot solder. The hot solder runs down the thin edges of the slot resulting in a poor mechanical and electrical joint. Often times a second wire in the slot will not touch both sides of the slot, and the second lead cannot be properly constrained within the slot because the slot is in the "plane" of the flat material and the slot thereby cannot be pinched without severe distortion of the connector.

The aforesaid disadvantages are avoided in accordance with one embodiment of the invention wherein an electrical terminal made from suitable sheet metal is provided with a body portion having a hollow depending channel shaped leg and a plurality of upwardly extending fingers. A central one of the fingers is offset at its root to provide a seat at its lower end, lying generally between the lower ends of all the fingers and overlying the hollow of the leg. Spaced apart flat sides of the central and other fingers face each other to provide lead receiving slots with generous side walls for improved solder receptivity and retention. The offset seat of the central finger provides a pedestal for solder retention, and prevents the escape of hot solder through the hollow leg.

It is therefore an object of the present invention to provide a new and improved conductive post for receiving and supporting electrical leads.

Another object is to provide an electrical terminal capable of receiving a plurality of electrical leads from different directions, and having structural features providing for improved solder receptivity and retentivity.

Another object is to provide an electrical terminal for a plurality of component leads and having improved soldering capabilities whereby solder connections are made quicker, neater and with less waste of solder.

Another object of the invention is to provide an improved "lead through" terminal which minimizes or eliminates the run-off of solder through the hollow leg in the course of an "above board" soldering operation.

A further object of the present invention is to provide a terminal with a slot capable of receiving a plurality of different diameter leads at the same time and effectively holding the same for a good solder joint.

A still further object of the present invention is to provide a rugged and inexpensive sheet metal "lead through" terminal.

Still another object is to provide a sheet metal terminal which is economical to produce and lends itself to known manufacturing techniques.

It is a still further object of the invention to provide a terminal post that may if desired also be used only for the mechanical support of intersecting leads or overlapping leads which may be soldered where they cross or overlap.

Another object resides in providing a terminal which will hold components off the panel or board to improve heat dissipation, and prevent damage to the board, and avoid bends in and excessive length of leads.

Other and further objects and advantages will be apparent from the following description taken in connection with the accompanying drawings wherein there is illustrated a preferred embodiment of the invention.

Figures 1, 2, 3, 4, 5, 6:
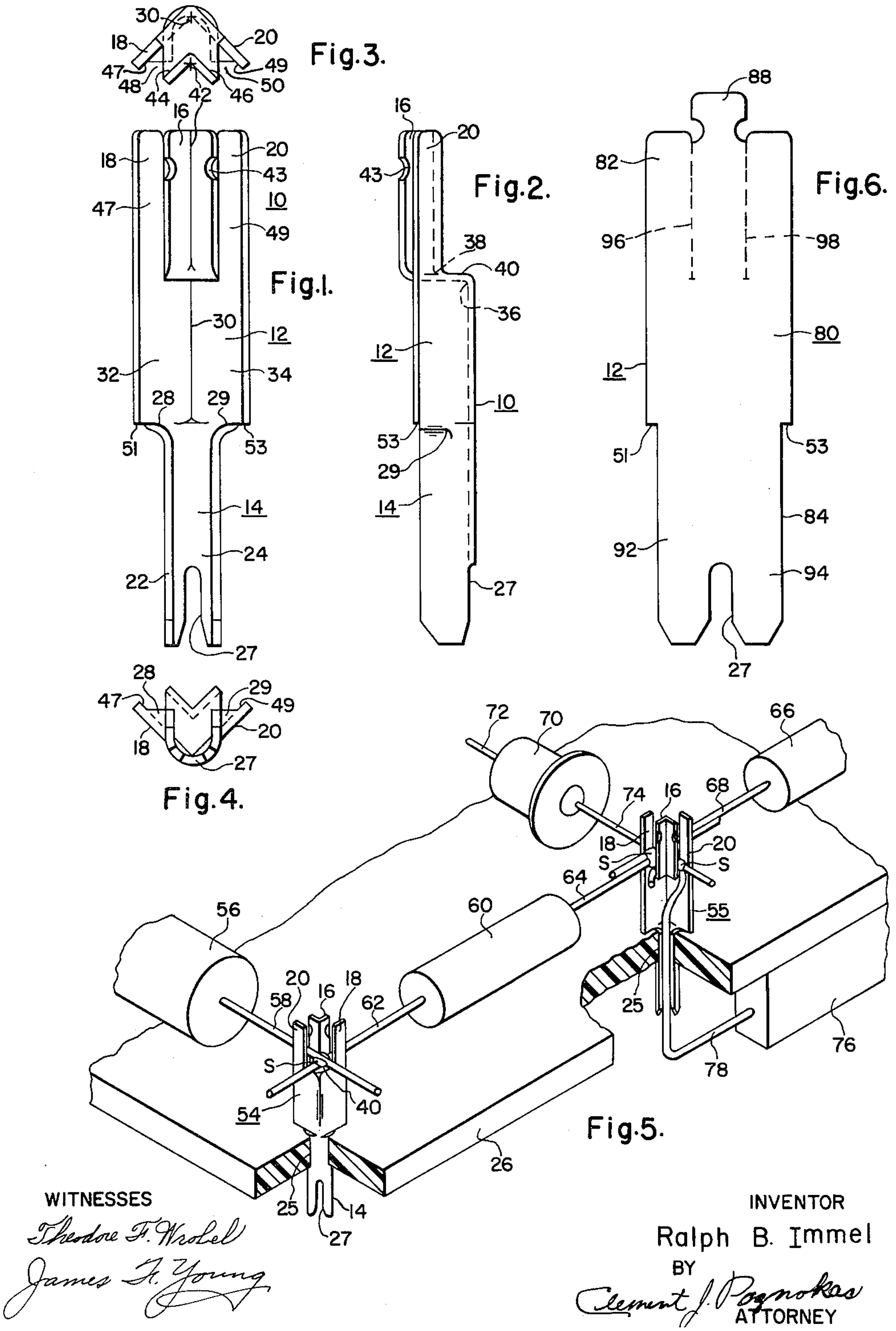
FIGURES 1, 2, 3 and 4 are respectively front, side, plan and bottom views of a conductive post embodying features of the invention.
FIG. 5 is a perspective view of a circuit assembly showing electrical components with leads carried by terminal posts of the present invention inserted with press fit into apertures of a circuit board.
FIG. 6 is a view illustrating the configuration of the sheet metal blank from which the post of FIGURE 1 may be fabricated.

Referring now to FIGS. 1, 2, 3 and 4, a terminal post 10, which is desirably made from sheet metal, includes a body portion 12, a longitudinally depending hollow leg 14, upwardly longitudinally extending center and outer fingers 16, and 18 and 20, respectively. The hollow leg 14 is channel-shaped, having side portions 22 and 24, and is laterally deformable to provide a substantial press fit when inserted in an aperture 25 of an insulating circuit board 26 as illustrated in FIG. 5. The free end of the leg is provided with a notch 27 for the reception of an electrical lead if desired. At this end of the leg the channel sides are tapered (FIG. 2) to facilitate insertion of the leg into an aperture 25. The upper end of leg 14 is flared out at 28 and 29 to provide a smooth "flowing" junction between the leg and the body 12. This adds strength to the post and aids in providing a snug fit in the aperture 25.

The body section 12 has a generally V-shaped cross-section provided by a substantially right angle bend or fold around a longitudinal axis 30 which passes through the apex of the V as best seen in FIGURE 3. As a result of the V-shape, the body section 12 has two side elements 32 and 34 in intersecting planes at substantially right angles. Fingers 18 and 20, being substantially extensions of elements 32 and 34, lie in planes which intersect at the longitudinal axis 30.

Adjacent its lower end, the center finger 16 has successive outward and upward substantially right angle bends 36 and 38 crosswise of the finger 16 thereby offsetting the finger 16 relative to the fingers 18 and 20 and the body section 12, and also forming an upwardly facing seat 40 which overlies the hollow of the leg 14. The portion of the finger 16 extending upwardly from the seat 40 has a generally V-shaped cross-section with the apex of the V wrapped around a longitudinal axis 42 which is parallel to the longitudinal axis 30. The sides of the V cross-section provide the finger 16 with major surfaces forming flat faces 44 and 46 which lie in respective planes intersecting at substantially right angles. Each of these faces is spaced from and faces a different one of the outer fingers 18 and 20. More specifically, an inwardly facing major surface 47 of finger 18 faces surface 44, and an inwardly facing major surface 49 of finger 20 faces surface 46. By contrast, the edge surface of the sheet metal from which the terminal is made, presents a minor surface, being only as wide as the thickness of the sheet metal. The spaces between the outer fingers and the center finger form slots 48 and 50 for the reception of electrical leads from four possible directions. Finger 16 is notched at 43 to receive fine wire leads which may be wound around the notched portion of the finger and soldered thereat. Shoulders 51 and 53, formed in opposite edges of the body 12 at the lower end thereof, preventing the body 12 from entering the aperture 25, whereby leads received by the slots 48 and 50 are supported at a sufficient distance from the panel board 28 to hold their associated components off the board. This provides better heat dissipation and prevents damage to the board.

FIGURE 5 shows the post in various use arrangements. In this figure there are shown two terminal posts or lugs 54 and 55 of the type illustrated in FIGURE 1. The legs of these terminals are inserted in and through apertures 25 of an insulating circuit board 26, which may carry all the components of a complete electronic assembly, or it may be just a terminal strip. In this figure there is further shown a capacitor 56 with a lead 58, a resistor 60 with leads 62 and 64, a resistor 66 with a lead 68, a semiconductor diode 70 with leads 72 and 74. A transformer 76 with a lead 78 is mounted on the under side of the board 26.

Leads 58 and 62 are laid in slots 50 and 48 respectively of the post 54, the courses of which slots intersect at right angles. Thus, the leads 58 and 62 intersect at right angles immediately above the seat 40 of this post. A relatively small amount of solder is required to solder the leads to each other and to the post. The seat 40 retains solder and prevents it from slipping down the post. Solder is flowed in the slots 48 to 50 around the leads 58 and 62 therein. The flat faces of the fingers on opposite sides of each slot are very conducive to solder reception and retention. Because of this feature and the seat 40 only a small amount of solder is required to make a neat and very serviceable joint very quickly. Solder points are indicated by the reference character "S."

Since no further leads are connected to this terminal post, electrical connection from lead 58 to 62 may if desired be effected by merely soldering their intersection without attempting to bond these leads to the post 54. This permits a neat solder joint and ease of assembly and disassembly.

A different arrangement is shown in connection with post 55. Lead 78 passes through the hollow leg of post 55 and is wrapped or hooked over the seat 40 of this post and soldered to the post as shown. The seat 40 retains hot solder and prevents it from slipping through or down the side of the hollow of the leg 14 of post 55. Leads 64 and 68 lie on top of one another in slot 48 of post 55 while lead 74 lies in slot 50 of this post thereby intersecting leads 64 and 68 at a point over the seat 40 of the post. The leads are soldered not only to each other but also to the fingers of the post, the flat faces of the fingers on opposite sides of each slot being very conducive to solder reception and retention. With one or more leads in a slot the outer finger defining the slot may be easily bent slightly in its flat plane to grip the leads between the outer finger and the center finger while they are being soldered. This is conveniently accomplished by encompassing the outer fingers within the jaws of a pair of pliers and slightly squeezing the outer fingers toward the center finger. Because of the accommodating conformability of the flat walls of the slot, a relatively great number of leads, for example, six or eight of the same or different gauge, may be accommodated in a slot with effective contact between all the leads and the defining fingers of the slot. It has been found in practice that the configuration of the terminal post described herein results in greater solder receptivity and retention and better mechanical support for the leads during the soldering operation. The seat 40 in particular helps to retain solder and prevent it from slipping down the post.

In FIGURE 6 there is illustrated a sheet metal blank from which the post of FIGURE 1 may be fabricated. Any suitable metal, such as brass, beryllium copper, steel, etc., may be employed.

The blank 80, which is generally rectangular in shape, includes upper and lower sections 82 and 84 connected by a mid-section 12. The free end of the upper section terminates in an upwardly projecting reduced section 88 thus providing a stepped contour to the upper edge of the blank. The blank has generally straight sides except for shoulders 51 and 53 which offset the lower section 84.

A notch 27 bifurcates the free end of the lower section 84, forming two branches 92 and 94 each of which is tapered.

A terminal may be formed from the blank 80 in a number of ways. For example mating male and female dies conforming to the configuration of the terminal may be used which will in one or successive operations lance the blank along the dotted lines 96 and 98 and shape the terminal post to its end configuration.

Alternatively, the blank may be first lanced along the lines 96 and 98 to delimit three finger forming sections 16, 18, and 20. Next the center finger section 16 is pushed out at its base to form successive outward and upward bends across the finger, thus offsetting the finger 16 and providing the seat 40. Then either concurrently or in successive order the middle finger 16 and the body 12 are longitudinally bent to provide the generally V-shaped cross-section to these elements. In the meantime the lower section 84 can be formed into the channel shaped hollow leg 14 at almost any stage of the fabrication.

It is to be understood that the herein described arrangements are simply illustrative of the principles of the invention, and that other embodiments and applications are within the spirit and scope of the invention.

I claim as my invention:

1. A conductive post for carrying leads of circuit components, said post comprising a body portion, attachment means integral with said body portion for attaching said post to a support element, a middle finger integral with and extending upwardly from said body portion, said finger having two major generally flat surfaces facing away from each other and intersecting along an axis generally longitudinal of said finger, first and second outer fingers integral with and extending upwardly from said body portion, each of said outer fingers having a major surface, said outer fingers being spaced from and disposed on opposite sides of said axis whereby said surface of each outer finger faces a different one of said surfaces of the central finger thereby forming a lead receiving slot therebetween, the lower end of said middle finger having an offset portion forming an upwardly facing seat lying between said fingers.

2. A terminal post made of sheet metal for receiving leads of circuit components, said post comprising a body portion, a hollow leg integral with and depending from said body portion and adapted for insertion in an aperture in a supporting body, a middle finger integral with and extending upwardly from said body portion, said finger having two major generally flat surfaces facing away from each other and intersecting along an axis generally longitudinal of said finger, and first and second outer fingers integral with and extending upwardly from said body portion, each of said outer fingers having an inwardly facing major surface, said outer fingers being spaced from and disposed on opposite sides of said axis whereby said surface of each outer finger faces a different one of said surfaces of the middle finger thereby forming a lead receiving slot therebetween, the lower end of said middle finger having an offset portion forming an upwardly facing seat lying between said middle and outer fingers and overlying the hollow of said leg.

3. A conductive post for carrying electrical leads, said post comprising a body portion, a plurality of longitudinal elements extending upwardly from the body portion, one of said elements having a bend around a longitudinal axis thereby forming a plurality of outer faces lying respectively in intersecting planes, others of said elements each having a flat face lying in a plane substantially parallel to and outwardly spaced from an outer face of said one element, each of said flat faces being in spaced face-to-face relation with a different one of said outer faces, and attachment means integral with said body portion for attaching said post to a supporting element.

4. A conductive terminal post for carrying electrical leads, said post comprising a body portion, a plurality of longitudinal elements extending upwardly from the body portion, one of said elements having a bend around a longitudinal axis thereby forming a plurality of outer faces lying respectively in intersecting planes, others of said elements each having a flat face lying in a plane substantially parallel to and outwardly spaced from an outer face of said one element, each of said flat faces being in spaced face-to-face relation with a different one of said outer faces, a hollow laterally deformable pin integral with and extending downwardly from said body portion and adapted for insertion into an aperture in a supporting body with a press fit.

5. An electrical assembly comprising a circuit board having an aperture therein, and a terminal post for receiving leads of circuit components, said post comprising a body portion, a hollow leg integral with and depending from said body portion, said leg being disposed in said aperture, a middle finger integral with and extending upwardly from said body portion, said finger having two major generally flat surfaces facing away from each other and intersecting along an axis generally longitudinal of said finger, first and second outer fingers integral with and extending upwardly from said body portion, each of said outer fingers having an inwardly facing major surface, said outer fingers being spaced from and disposed on opposite sides of said axis whereby said surface of each outer finger faces a different one of said surfaces of the central finger thereby forming a lead receiving slot therebetween, the lower end of said middle finger having an offset portion forming an upwardly facing seat lying between said fingers and overlying the hollow of said leg.

6. An electrical assembly comprising a circuit board having an aperture therein, and a conductive terminal post for carrying electrical leads, said post comprising a body portion, a plurality of longitudinal elements extending upwardly from the main body portion, one of said elements having a bend around a longitudinal axis thereby forming a plurality of outer faces lying respectively in intersecting planes, others of said elements each having a flat face lying in a plane substantially parallel to and outwardly spaced from an outer face of said one element, each of said flat faces being in spaced face-to-face relation with a different one of said outer faces, and a hollow laterally deformable pin integral with and extending downwardly from said body portion, said pin being disposed in said aperture with a press fit.

7. The combination as in claim 3 and further including upwardly facing seat means integral with said body portion and disposed between said one and said others of said elements.

8. The combination as in claim 4 wherein the lower part of said one element has an offset portion forming an upwardly facing seat lying between said elements and overlying the hollow of said pin.

9. The combination as in claim 4 wherein said post is made of sheet metal.

10. The combination as in claim 6 wherein said post is made of sheet metal.

11. The combination as in claim 6 wherein said one element has an offset portion forming an upwardly facing seat lying between said one and said others of said elements and overlying the hollow of said pin.

12. A conductive terminal post for receiving electric circuit leads, said post comprising a body portion, a hollow leg integral with and depending from said body portion and adapted for insertion in an aperture in a supporting body, middle finger means integral with and extending upwardly from said body portion, said middle finger means having two major generally flat surfaces facing away from each other and lying in respective planes intersecting along an axis extending generally in said upwardly direction, first and second outer fingers integral with and extending upwardly from said body portion, each of said outer fingers having an inwardly facing major surface, said outer fingers being spaced from and disposed on opposite sides of said axis in such manner that said surface of each outer finger faces a different one of said surfaces of the middle finger means thereby forming a lead receiving slot therebetween, the lower end of said middle finger means having offset means forming upwardly facing seat means lying between said finger means and said outer fingers and overlying the hollow of said leg.

References Cited by the Examiner

UNITED STATES PATENTS

| | | | |
|---|---|---|---|
| 2,482,990 | 9/1927 | Olson | 29—190 |
| 2,139,535 | 12/1938 | Young | 339—221 |
| 2,450,723 | 10/1948 | Elrad | 29—190 |
| 2,640,185 | 5/1953 | Alden | 339—275 X |
| 2,947,965 | 8/1960 | Scoville | 339—220 X |
| 3,049,689 | 8/1962 | Clarkson | 339—17 |
| 3,148,925 | 9/1964 | Harano | 339—221 |

FOREIGN PATENTS

| | | |
|---|---|---|
| 618,933 | 4/1961 | Canada. |

JOSEPH D. SEERS, *Primary Examiner.*

PATRICK A. CLIFFORD, *Examiner.*